United States Patent
Lui et al.

(10) Patent No.: US 6,970,117 B1
(45) Date of Patent: *Nov. 29, 2005

(54) BYTE ALIGNMENT FOR SERIAL DATA RECEIVER

(75) Inventors: Henry Y. Lui, San Jose, CA (US);
Chong H. Lee, San Ramon, CA (US);
Rakesh Patel, Cupertino, CA (US);
Ramanand Venkata, San Jose, CA (US); John Lam, Union City, CA (US);
Vinson Chan, Fremont, CA (US);
Malik Kabani, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 1 day.

This patent is subject to a terminal disclaimer.

(21) Appl. No.: 10/789,406

(22) Filed: Feb. 26, 2004

Related U.S. Application Data

(63) Continuation of application No. 10/454,626, filed on Jun. 3, 2003, now Pat. No. 6,724,328.

(51) Int. Cl.[7] ............................................. H03M 9/00

(52) U.S. Cl. ..................................... 341/101; 341/100

(58) Field of Search ............................... 341/101, 100, 341/50, 51

(56) References Cited

U.S. PATENT DOCUMENTS

| 5,689,195 | A | 11/1997 | Cliff et al. ..................... 326/41 |
| 6,724,328 | B1 * | 4/2004 | Lui et al. ..................... 341/101 |
| 2001/0033188 | A1 | 10/2001 | Aung et al. .................. 327/141 |
| 2002/0190751 | A1 | 12/2002 | Lee et al. ...................... 326/39 |
| 2003/0052709 | A1 | 3/2003 | Venkata et al. ............... 326/37 |

* cited by examiner

*Primary Examiner*—Peguy Jeanpierre
*Assistant Examiner*—Joseph Lauture
(74) *Attorney, Agent, or Firm*—Fish & Neave IP Group of Ropes & Gray LLP; Jeffrey H. Ingerman

(57) ABSTRACT

A serial data interface for a programmable logic device includes a receiver that deserializes a plurality of channels of received serial data using a recovered clock signal or a phase-aligned received clock signal. Byte boundaries are initially assigned, perhaps arbitrarily, and the deserialized signal is sent to the programmable logic core of the programmable logic device. Programmable logic in the core monitors the byte boundaries on each channel based on the criteria, including any user-defined parameters, programmed into the logic. If a boundary misalignment is detected, a signal is send from the core to bit-slipping circuitry on that channel of the interface to adjust the boundary. The signal could instruct the bit-slipping circuitry to adjust the boundary by the number of bits needed to correct the alignment. Alternatively, the bit-slipping circuitry could operate iteratively, adjusting the boundary by one bit, each cycle, until the signal stops indicating misalignment.

29 Claims, 3 Drawing Sheets

BYTE ALIGNMENT FOR SERIAL DATA RECEIVER

CROSS REFERENCE TO RELATED APPLICATION

This is a continuation of commonly-assigned U.S. patent application Ser. No. 10/454,626, filed Jun. 3, 2003, now U.S. Pat. No. 6,724,328.

BACKGROUND OF THE INVENTION

This invention relates to serial data receivers. More particularly, this invention relates to apparatus for controlling byte alignment in deserialized data output of a serial data receiver, especially a serial data receiver used with a programmable logic device. High-speed serial signaling is becoming an increasingly important form of signaling between electronic devices. For example, Low Voltage Differential Signaling ("LVDS") has become a common form of signaling. Typically the data represent bytes of information that are being transmitted one after another. The usual definition of a byte is eight bits, but as used herein "byte" can refer to any plural number of bits such as eight bits, nine bits, ten bits, eleven bits, or fewer or more than these numbers of bits. When the data is received, one task that the receiving circuitry must typically perform is to find the boundaries between the successive bytes in the received serial bit stream. This may be referred to as "byte alignment" or "byte synchronization".

To facilitate byte alignment, it is typical to transmit special bytes at the start of a packet of bytes of data. The receiver circuitry looks for the special byte pattern in the incoming data. When the receiver circuitry finds the special byte pattern, it knows where the boundaries between subsequent bytes are. This makes it possible for the receiver circuitry to properly handle the subsequent bytes of data.

A problem that can occur with known byte alignment circuitry is the following. It is difficult or impossible for such circuitry, once aligned, to properly deal with subsequent receipt of the special byte pattern, especially if that pattern is received out of alignment with what has already been determined to be proper byte alignment. Such an out-of-alignment special byte pattern may be due to such circumstances as: (1) the special byte pattern originally received is not really a special byte, but just some bits in one data byte followed by some bits in the succeeding data byte that together happen to have the same pattern as a special byte; or (2) byte alignment has been lost, and byte alignment should be re-established based on the newly received special bytes.

Programmable logic devices ("PLDs") are well known as shown, for example, by such references as Cliff et al. U.S. Pat. No. 5,689,195, Cliff et al. U.S. Pat. No. 5,909,126, Jefferson et al. U.S. Pat. No. 6,215,326, and Ngai et al. U.S. Pat. No. 6,407,576. In general, a PLD is a general-purpose integrated circuit device that is programmable to perform any of a wide range of logic tasks. Rather than having to design and build separate logic circuits for performing different logic tasks, general-purpose PLDs can be programmed in various different ways to perform those various logic tasks. Many manufacturers of electronic circuitry and systems find PLDs to be an advantageous way to provide various components of what they need to produce.

It is known to use high-speed serial signaling with PLDs. PLDs designed for use with high-speed serial signaling typically include, in their input/output circuitry, programmable interfaces that can be used with one or more high-speed serial protocols, with the ability to programmably select the portions of the circuitry for a particular protocol. However, although programmable, such interfaces have heretofore been built with particular choices of protocol in mind, so that even minor changes in a protocol necessitate redesigning the receiver circuitry and hence the PLD. For example, if the aforementioned byte alignment circuitry is built to recognize a particular special byte, and it is desired to use a new special byte, it may be necessary to redesign the byte alignment circuitry of the receiver, and therefore the entire receiver and by extension the entire PLD. Similarly, if other parameters change, or if improved logic for recognizing and handling byte misalignment situations is developed, new byte alignment circuitry might have to be designed.

It also is known to control byte alignment using programmable logic in the programmable core of a PLD, but heretofore this alignment has been performed on the high-speed serial data across all channels. As serial interface speeds become ever higher, accurately byte-aligning data becomes more difficult, because it becomes more difficult to assure that the bit-slipping signal arrives at the correct clock cycle. Moreover, differences in skew across different channels mean that a proper byte alignment for one channel might not be proper for all channels. If the byte alignment is not correct, further byte alignment will have to be performed before the high-speed serial interface is properly synchronized.

It would be desirable to be able to use the programmable nature of PLDs to avoid having to design and build a new high-speed serial receiver every time one parameter of a protocol changes, and to byte-align the incoming data as accurately as possible.

SUMMARY OF THE INVENTION

In accordance with this invention, a programmable logic device is provided with high-speed serial interface receiver circuitry for receiving and deserializing a plurality of channels of high-speed serial data. However, the receiver circuitry does not include complete byte alignment circuitry. Instead, each channel of the receiver circuitry is provided with bit-slipping circuitry for performing byte alignment, so that each channel can be separately aligned, taking into account the particular skew in that channel. Moreover, the byte alignment logic that controls the bit-slipping process is implemented in the PLD logic core. This allows the user to determine how the byte alignment is to be performed.

In most cases, the user would likely implement a known logic module for performing byte alignment, but by implementing such logic in the PLD logic core, the user could more easily change the special pattern that signals the beginning of a byte, or other parameters of the byte alignment process. Instead of redesigning the byte alignment circuitry in the receiver to change those parameters, the user merely reprograms the byte alignment logic in the PLD core. Similarly, the user could change the logic itself, if in a particular user application different logic for recognizing byte alignment or handling byte misalignment situations is required. The logic core of a PLD is particularly suited for designing and implementing such logic, either as conventional programmable logic or as a state machine. On the other hand, the logic core of a PLD is less well suited for performing the actual alignment process, and therefore according to the invention specialized bit-slipping circuitry for performing the alignment process continues to be provided in the high-speed serial interface circuitry.

In one embodiment, a byte boundary may be assumed initially. As the byte alignment logic in the PLD logic core monitors the incoming signal on each channel, it may determine that the initial boundary selected on a particular channel is incorrect. The logic would then send a control signal to the bit-slipping circuitry in that channel of the high-speed serial interface, instructing that circuitry to move the boundary. In one variation of this embodiment, byte alignment logic in the PLD logic core is capable of determining, in one step, the number of bits by which the boundary is misaligned, and instructs the bit-slipping circuitry to make the correct adjustment in one step. In another variation, the bit-slipping circuitry moves the boundary by one bit in response to a determination of byte misalignment. If more than one bit of slippage is required, the byte alignment logic in the PLD core will determine that the byte alignment is still incorrect, and will send another bit-slipping signal to the bit-slipping circuitry. This will continue iteratively until the boundary has been moved the correct number of bits to achieve proper alignment.

In any case, the byte alignment as just described preferably occurs in the byte domain—i.e., at the slower byte clock rate. This makes the byte alignment more accurate and reliable, because at slower clock rates, it is easier to account for skew between the bit-slipping signal and the data signal, so that it is easier to assure that the correct bit position is being selected as the byte boundary location.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1–3.

Figure 1:
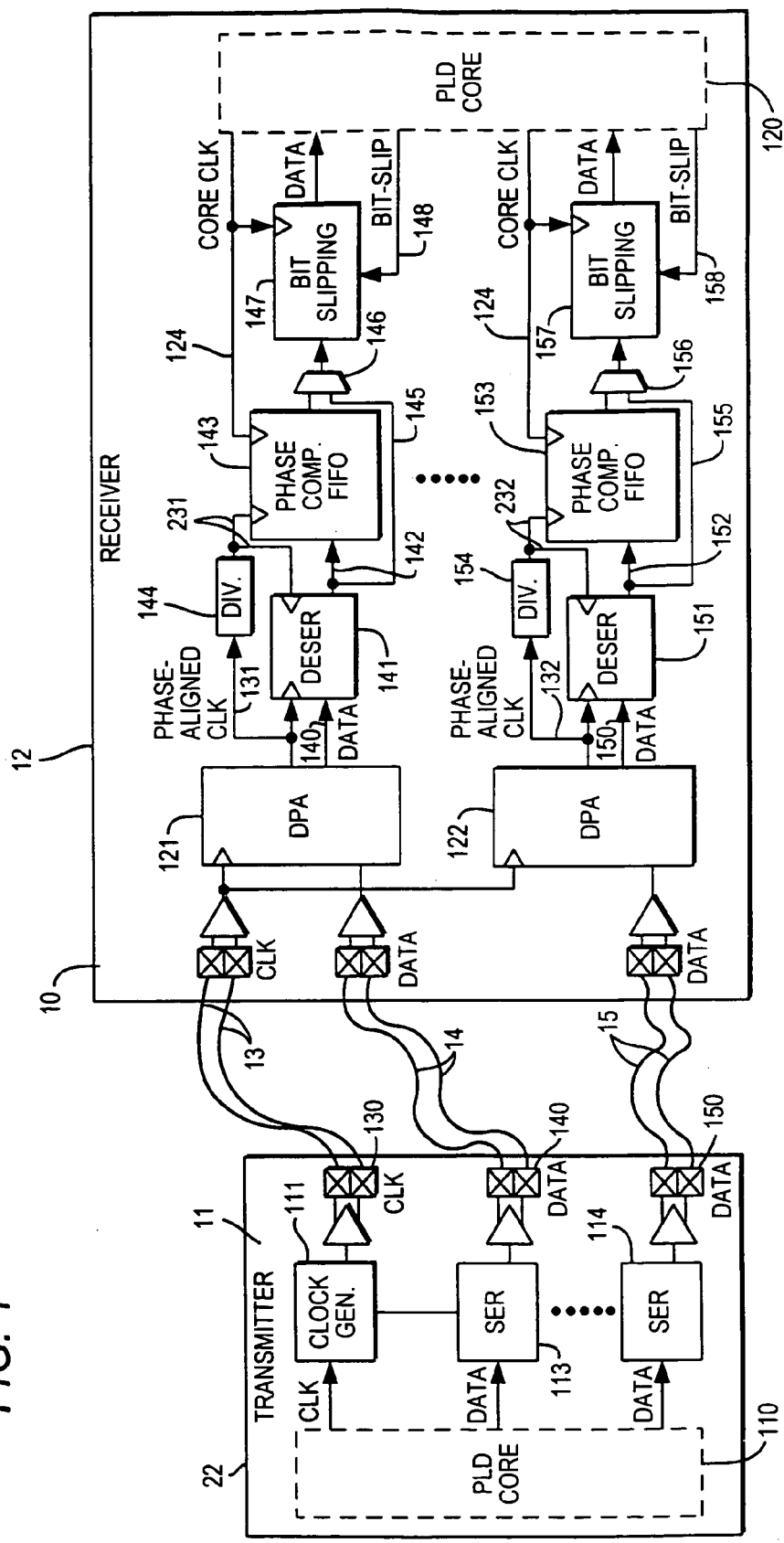
FIG. 1 is a schematic representation of a preferred embodiment of a programmable logic device, with serial interface, in accordance with the present invention.

FIG. 1 shows one preferred embodiment of a programmable logic device 12 having a serial interface 10 incorporating the present invention. With respect to the present invention, serial interface 10 need only be a receiver, but it can also include a transmitter for sending signals to other devices. A second programmable logic device 22 includes a transmitter 11 shown in FIG. 1, which is not part of the serial interface 10 of programmable logic device 12. Programmable logic device 12 can also receive signals from the transmitter of a completely different type of device via serial interface 10. In addition to serial interface 10, programmable logic device includes PLD core 120, which can include any type of programmable logic normally provided in such devices.

In the embodiment of FIG. 1, signal paths 13, 14, 15 conduct a clock signal and data signals between transmitter 11 and serial interface 10. The nonuniform depiction of signal paths 13, 14 and 15 signifies that the path lengths may be different, possibly giving rise to phase shift or skew.

In the system shown in FIG. 1, a clock signal 130 is generated by clock generator 111 of transmitter 11, based on an input 112 from PLD core 110, which could be derived from a crystal or other frequency standard (not shown). Clock signal 130 is used by serializers 113, 114, etc., to generate serialized data signals 140, 150, etc., from data signals 115, 116 output by PLD core 110. Clock signal 130 and serialized data signals 140, 150 are conducted to serial interface 10 on signal paths 13, 14, 15, respectively. At serial interface 10, data signals 140, 150 preferably are deserialized as described below.

Although signals 130, 140, 150, etc., share a common clock, phase differences or skew could develop between clock signal 130 and one or more of data signals 140, 150, etc., or between one of data signals 140, 150, etc. and another of data signals 140, 150, etc. Therefore, preferably the first thing that happens when the signals reach receiver 12 is that the phase of clock signal 130 is separately aligned to each respective data signal 140, 150, etc., by respective dynamic phase aligner 121, 122, etc., as described in copending, commonly-assigned U.S. patent application Ser. No. 10/349,541, filed Jan. 21, 2003, which is hereby incorporated by reference in its entirety.

In another embodiment, clock signal 130 may not be sent, or may only be a reference, and a separate clock may be derived directly from each data signal 140, 150, etc., by clock data recovery techniques such as those described in copending, commonly-assigned U.S. patent application Ser. Nos. 09/805,843, filed Mar. 13, 2001, and Ser. No. 10/059,014, filed Jan. 29, 2002, and in commonly-assigned U.S. Pat. No. 6,650,140, which are hereby incorporated by reference in their entireties, in which case the respective dynamic phase aligner 121, 122, etc. of each channel would be replaced by respective clock data recovery circuitry (not shown).

Respective phase-aligned or recovered clock signal 131, 132, etc., is used in respective deserializer 141, 151, etc. to deserialize respective data signal 140, 150, etc. As stated above, the respective phase-aligned or recovered clock signals 131, 132, etc., may not be aligned with each other. As a result, one or more channels of the deserialized data 142, 152, etc., and the phase-aligned or recovered clock 131, 132, etc., for that channel, can be out-of-phase with respect to the clock in the destination logic circuitry (e.g., core clock 124 of PLD core 120 in the PLD embodiment shown). Therefore, in each channel a respective phase compensation FIFO 143, 153, etc., preferably is provided. Each phase compensation FIFO 143, 153, etc. accepts respective deserialized data stream 142, 152, etc., and, under control of both the core clock 124 and the respective phase-aligned or recovered clock for the respective data channel, holds the deserialized data long enough to compensate for any phase difference between the core clock and the phase-aligned or recovered channel clock. Because after deserialization the data flow in bytes, rather than bits, a respective divider 144, 154, etc., is provided in each channel to divide the respective phase-aligned clock 131, 132, etc., by a divisor equal to the number of bits per byte, to produce a respective byte clock or parallel clock 231, 232, etc., for each respective channel. Core clock 124 is already at the lower byte clock rate.

Phase compensation FIFO 143, 153, etc. introduces several clock cycles of latency. In some applications, that latency may be unacceptable. Therefore, a respective bypass conductor 145, 155, etc., is provided in each channel to allow the user to bypass FIFO 143, 153 if desired. The selection between FIFO 143, 153, etc. and bypass 145, 155, etc., is made using respective multiplexer 146, 156, etc. However, users are strongly cautioned not to use bypass 145, 155, etc., unless they are confident that the data and core clocks are sufficiently in alignment.

A respective bit-slipping circuit 147, 157, etc. is provided in each data channel, clocked by core clock 124. The data in each channel preferably are initially transmitted to logic core 120 with an assumed byte boundary. That boundary preferably is tested by logic in core 120 which, as discussed above, preferably is programmed to recognize a special byte pattern as indicative of a byte boundary. If a byte boundary misalignment is detected—e.g., the special pattern is detected in what is believed to be the middle of a byte, or the special pattern is not detected at an expected byte boundary where it should be found—then a respective bit-slip signal 148, 158, etc., is sent to the corresponding bit-slip circuit 147, 157, etc. to cause the byte boundary to be shifted.

In one embodiment, the logic determines the number of bits by which the boundary is misaligned and signal 148, 158, etc., causes circuit 147, 157, etc. to shift the byte boundary by that number of bits. In another embodiment, signal 148, 158, etc., causes circuit 147, 157, etc., to shift the byte boundary by one bit. If the byte boundary is still misaligned, then another bit-slip signal 148, 158, etc., will be sent on each successive cycle until the byte boundary is properly aligned.

Providing a respective bit-slipping circuit 147, 157, etc., for each data channel allows a device according to the present invention to better accommodate cases where the data-to-clock skew differs for different channels.

It should be noted that while bit-slipping circuit 147, 157, etc., is shown downstream of phase compensation FIFO 143, 153, etc., it is possible to place bit-slipping circuit 147, 157, etc., upstream (not shown) of phase compensation FIFO 143, 153, etc. However, in such a case, bit-slipping is performed before the data have been phase-aligned with core clock 124. Therefore, instead of bit-slipping circuit 147, 157, etc., being clocked by core clock 124, bit-slipping circuit 147, 157 would be clocked by byte clock 231, 232, etc. In such an embodiment, bypass 145, 155, etc., could still be provided, and could be used by a user who is confident that the data and core clocks are sufficiently in alignment. Users of this embodiment as well would nevertheless be strongly cautioned to be careful when using bypass 145, 155, etc.

Whether phase compensation occurs before or after bit-slipping, in accordance with the invention, bit-slipping occurs in the parallel, or byte, domain, which allows the bit-slipping to be controlled more accurately than in the high-speed serial clock domain. Moreover, because bit-slipping is being performed separately for each channel, the accuracy of the bit-slipping is further improved because differences in skew among the different channels is inherently taken into account.

Figure 2:
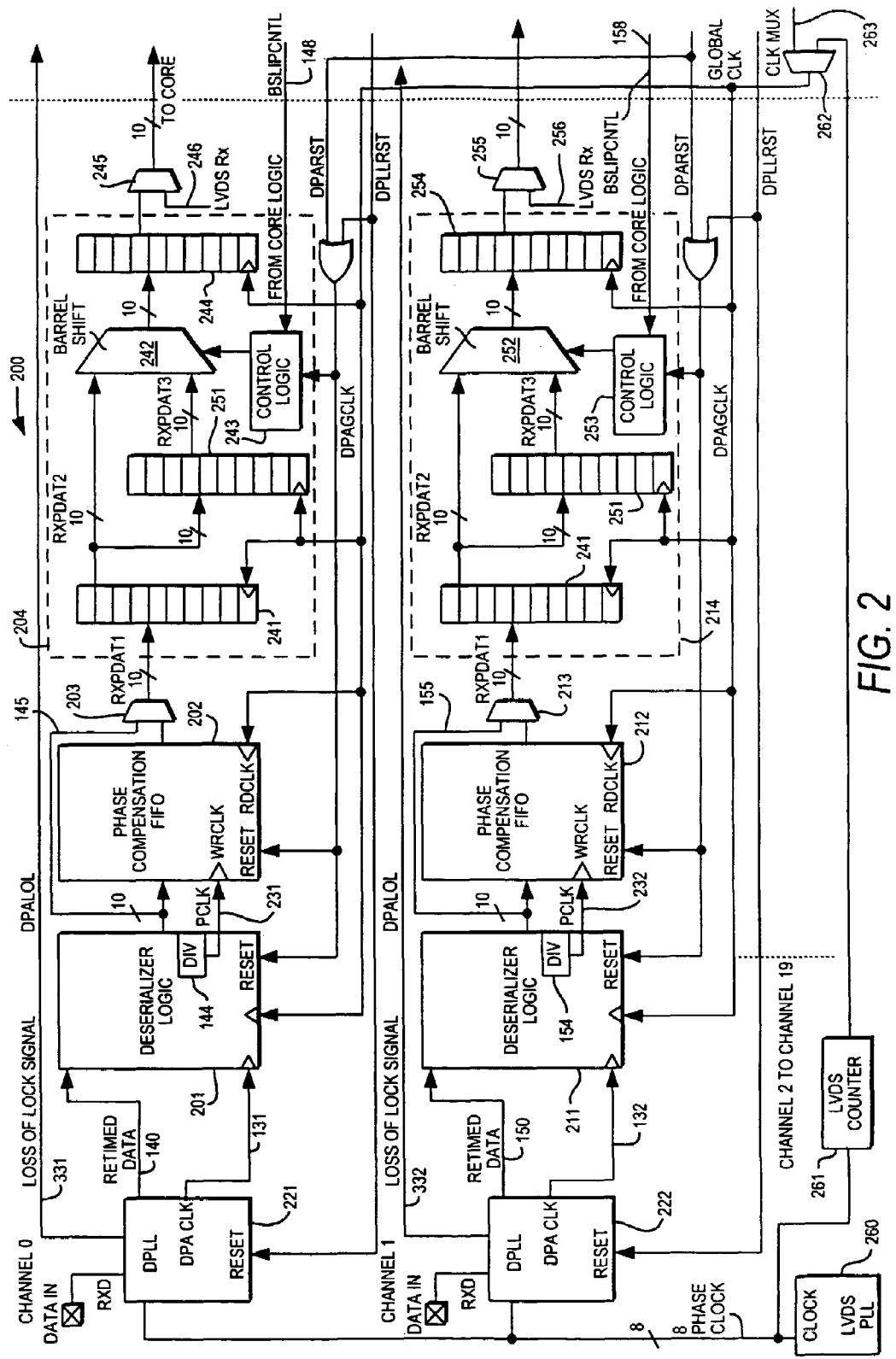
FIG. 2 is a schematic diagram of a preferred embodiment of a receiver of a serial interface similar to FIG. 1.
Figure 3:
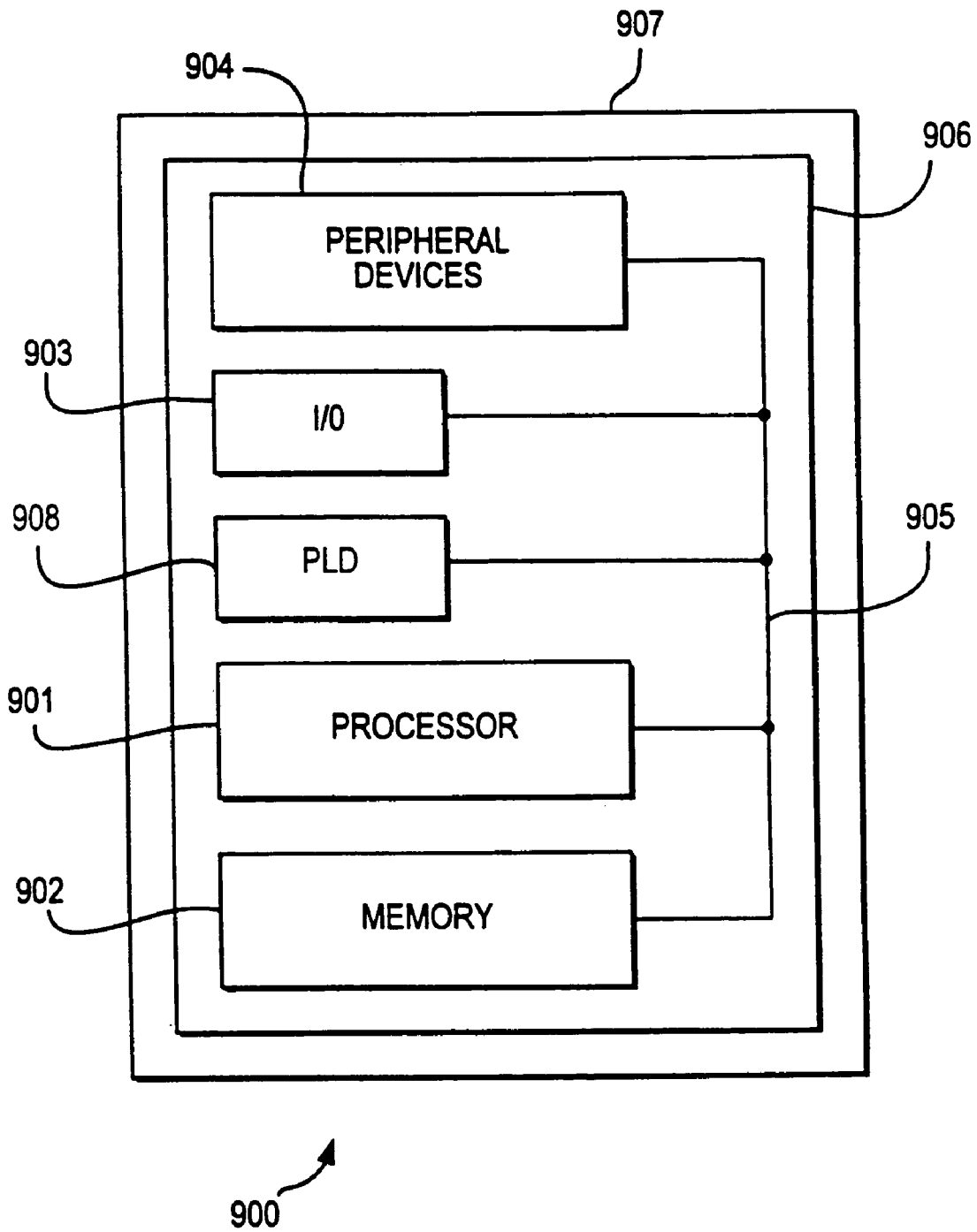
FIG. 3 is a simplified block diagram of an illustrative system employing a programmable logic system in accordance with the invention.

A preferred embodiment 200 of a serial interface 12 in accordance with the invention in a PLD is shown in FIG. 2. Like FIG. 1, FIG. 2 shows two data channels. However, there may be additional channels, and as indicated in FIG. 2 there are twenty channels. Deserializer logic 201, 211, etc., corresponds to deserializer 141, 151, etc. A respective divider corresponding to divider 144, 154, etc., preferably is built into deserializer logic 201, 211, etc., to provide respective phase-aligned byte clock PCLK. Phase compensation FIFO 202, 212, etc., corresponds to phase compensation FIFO 143, 153, etc., while multiplexer 203, 213, etc., corresponds to multiplexer 146, 156, etc. Bit slipping logic 204, 214, etc., corresponds to bit slip circuit 147, 157, etc., and in the embodiment illustrated includes two 10-bit input shift registers 241, 251, etc., chained serially so that two 10-bit bytes are available to each of barrel shifter 242, 252, etc. Each of barrel shifters 242, 252, etc., selects a contiguous ten of the twenty available input bits, under the control of logic 243, 253, etc., as directed by bit-slip control signal (BSLIPCNTL) 148, 158, etc., and outputs them as the newly-aligned data byte to 10-bit output register 244, 254, etc.

Specifically, in one embodiment, the byte alignment logic (not shown) in the PLD core determines the number of bits by which the byte boundary should be slipped and raises control signal 148 (BSLIPCNTL) high that number of times. Control logic 243, 253, etc., contains a counter (not shown), which counts the number of times the control signal 148 (BSLIPCNTL) goes high. Alternatively, the byte alignment logic in the PLD core may send a binary signal that encodes a number of bits of slippage that is required. Either way, whether determined by a counter in control logic 243, 243, etc., or sent directly from the PLD core, the count of the number of bits of slippage that is required is then presented to barrel shifter 242, 252, etc., which uses the information to determine how many of the ten output bits should come from register 241 (the ten newest bits); the remainder will come from register 251 (the ten older bits). For example, if the count is 0, no bits will come from register 241 and all ten bits will come from register 251. If the count is 1, bit 0 (the least significant bit) will come from register 241, while bits [9:1] will still come from register 251. If the count is 2, bits [1:0] will come from register 241, while bits [9:2] will come from register 251. The pattern holds for higher counts. When the count reaches 9, then bits [8:0] will come from register 241, and only bit 9 will come from register 251. After that, if signal 148 goes high again, the counter would be reset to 0, and the process would start over again. It will be apparent that for embodiments with different byte widths, the number of counts after which the counter is reset to 0 will be n-1, where n is the byte width—i.e., the counter will count from 0 to n-1, and then loop back to 0 and start over.

In another embodiment, the byte alignment logic in the PLD core determines that the byte boundary should be slipped, but not by how much, and raises control signal 148 (BSLIPCNTL) high once. Control logic 243, 253, etc., responds to that signal by causing barrel shifter 242, 252, etc. to slip the byte boundary by one bit. If one bit of slippage is not sufficient, the byte alignment logic in the PLD core will continue to detect misalignment, and will again raise signal 148 high, so that control logic 243, 253, etc. will again cause barrel shifter 242, 252, etc. to slip the byte boundary by one bit. This will continue iteratively, with the byte boundary slipping one bit per cycle, until the misalignment is completely eliminated.

The foregoing examples apply to the case where the data bus is ten bits wide. By changing the widths of registers 241, 251, and programming the appropriate limit for the counter in any embodiment in which the counter is used, as described above, busses of any width can be used. Because receiver 200 is part of a PLD, it is designed to allow use with other signaling formats. Therefore, a respective multiplexer 245, 255, etc., is provided between output register 244, 254, etc., to allow selection of the data in register 244, 254, etc., or, e.g., data 246, 256, etc., from another serial data receiver (not shown).

In receiver 200, dynamic phase aligner 121, 122, etc., preferably is formed from a phase-locked loop ("PLL"), such as digital phase-locked loop ("DPLL") 221, 222, etc., together with a single PLL 260 which cooperates with all of the DPLLs, providing the eight phase-delayed clock signals discussed above, which are compared within each DPLL 221, 222, etc., to the respective input clock. When the user of the PLD of which receiver 200 is a part has selected LVDS signaling, PLL 260 also provides the high-speed LVDS clock, while counter 261 divides the high-speed LVDS bit clock of PLL 260 by the number of bits per byte to provide the system byte clock. That byte clock is one of two selections at multiplexer 262 for the global system clock (GLOBALCLK), which also serves as the dynamic phase alignment global clock (DPAGCLK). The user may also select alternate clock 263.

It can be seen from FIG. 2 that each DPLL 221, 222, etc. provides not only the phase-aligned clock 131, 132, etc., but also data 231, 232, etc., retimed to the respective phase-aligned clock. A loss-of-lock signal (DPALOL) 331, 332, etc., also is supplied to logic core 120 so that it can take appropriate action if any of the DPLLs loses its lock on its respective input signal. For example, core 120 may assert the DPLL reset signal (DPLLRST) or the dynamic phase alignment reset signal (DPARST).

Although each dynamic phase aligner 121, 122, etc, has been described as including a DPLL 221, 222, etc., in combination with PLL 260, it should be noted that this is for illustrative purposes only, and other dynamic phase alignment circuitry could be used. In such circuitry, each dynamic phase aligner 121, 122, etc., could be completely self-contained, without sharing PLL 260 or any other component. Moreover, as discussed above, clock data recovery circuitry could be provided in place of dynamic phase alignment circuitry.

As stated above, the user can program logic into PLD core 120 to test the byte alignment and generate bit-slipping signal 148, 158, etc. The logic can be custom logic designed specifically by the user, or can be a commercially available logic module, implementing byte alignment logic similar to that described in copending, commonly-assigned application Ser. No. 10/317,262, filed Dec. 10, 2002, which is hereby incorporated by reference in its entirety, but which may or may not include customizable parameters as discussed above.

Serial interface 10 according to the present invention, and a PLD 908 incorporating such an interface, may be used as part of a data processing system 900 shown in FIG. 5. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 908 can be used to perform a variety of different logic functions. For example, PLD 908 can be configured as a processor or controller that works in cooperation with processor 901. PLD 908 may also be used as an arbiter for arbitrating access to a shared resources in system 900. In yet another example, PLD 908 can be configured as an interface between processor 901 and one of the other components in system 900. It should be noted that system 900 is only exemplary, and that the true scope and spirit of the invention should be indicated by the following claims.

Various technologies can be used to implement PLDs 908 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A method of aligning a boundary between bytes of a deserialized serial data signal that has been input into a programmable logic device, said programmable logic device having a serial data interface, and having a programmable logic core, said method comprising:
  receiving a serial data signal at said serial data interface;
  deserializing said serial data signal, including inserting an initial candidate byte boundary between selected bits of said deserialized data signal;
  transmitting said deserialized data signal with said initial candidate byte boundary to said programmable logic core;
  processing said deserialized signal with said initial candidate byte boundary in said programmable logic core to validate said initial candidate byte boundary; and
  sending a byte alignment error signal from said programmable logic core to said serial data interface when said candidate boundary is determined to be invalid.

2. The method of claim 1 further comprising:
  assigning based on said error signal an alternate candidate byte boundary between different selected bits of said deserialized data signal on said serial data interface;
  retransmitting said deserialized data signal with said alternate candidate byte boundary from said serial data interface to said programmable logic core; and
  reprocessing said retransmitted deserialized data signal with said alternate candidate byte boundary in said programmable logic core to validate said alternate candidate byte boundary.

3. The method of claim 2 wherein:
  said error signal indicates a number of bits of discrepancy in said byte boundary; and
  said assigning an alternate candidate byte boundary comprises moving said byte boundary by said number of bits of discrepancy.

4. The method of claim 2 wherein:
  said assigning an alternate candidate byte boundary comprises moving said byte boundary by one bit; and
  said sending, said assigning, said retransmitting and said reprocessing occur iteratively until said reprocessing determines that said alternate candidate byte boundary is correct.

5. A method of aligning a boundary between bytes of a deserialized serial data signal that has been input into a programmable logic device, said programmable logic device having a serial data interface, and having a programmable logic core, said method comprising:
  receiving a serial data signal at said serial data interface;
  deserializing said serial data signal, including inserting an initial candidate byte boundary between selected bits of said deserialized data signal;
  transmitting said deserialized data signal with said initial candidate byte boundary from said serial data interface to said programmable logic core; and
  receiving a byte alignment error signal from said programmable logic core at said serial data interface when said candidate boundary is determined in said programmable logic core to be invalid.

6. The method of claim 5 further comprising:
assigning based on said error signal an alternate candidate byte boundary between different selected bits of said deserialized data signal at said serial data interface;
retransmitting said deserialized data signal with said alternate candidate byte boundary from said serial data interface to said programmable logic core; and
again receiving a byte alignment error signal from said programmable logic core at said serial data interface when said candidate boundary is determined in said programmable logic core to be invalid.

7. The method of claim 6 wherein:
said error signal indicates a number of bits of discrepancy in said byte boundary; and
said assigning an alternate candidate byte boundary comprises moving said byte boundary by said number of bits of discrepancy.

8. The method of claim 6 wherein:
said assigning an alternate candidate byte boundary comprises moving said byte boundary by one bit; and
said receiving, said assigning and said retransmitting occur iteratively until said alternate candidate byte boundary is determined in said programmable logic core to be correct.

9. A programmable logic device comprising:
a programmable logic core; and
a serial data interface adapted to receive and deserialize a serial data signal, said serial data interface comprising bit-slipping circuitry adapted to a insert a byte boundary between bits of said deserialized data signal, said bit-slipping circuitry being responsive to a bit-slipping control signal from said programmable logic core.

10. The programmable logic device of claim 9 wherein said bit-slipping circuitry comprises bit-handling circuitry and control circuitry that controls said bit-handling circuitry responsive to said bit-slipping control signal.

11. The programmable logic device of claim 10 wherein:
each byte includes a first number of bits; and
said bit-handling circuitry comprises:
at least one shift register for receiving said serial data, and having capacity to hold a second number of bits greater than said first number of bits, and further having a number of parallel outputs equal to said second number of bits, and
selection circuitry having a number of selection inputs equal to said number of parallel outputs of said at least one shift register, and having a number of selection outputs equal to said first number of bits, said selection inputs being connected to said parallel outputs of said at least one shift register; wherein:
said control circuitry controls which of said selection inputs is connected to said selection outputs.

12. The programmable logic device of claim 11 wherein said selection circuitry is a barrel shifter.

13. The programmable logic device of claim 11 wherein said second number of bits is twice said first number of bits.

14. The programmable logic device of claim 13 wherein said at least one shift register comprises two shift registers chained serially, each of said shift registers having capacity to hold said first number of bits.

15. A digital processing system comprising:
processing circuitry;
a memory coupled to said processing circuitry; and
a programmable logic device as defined in claim 9 coupled to the processing circuitry and the memory.

16. A printed circuit board on which is mounted a programmable logic device as defined in claim 9.

17. The printed circuit board defined in claim 16 further comprising:
memory circuitry mounted on the printed circuit board and coupled to the programmable logic device.

18. The printed circuit board defined in claim 17 further comprising:
processing circuitry mounted on the printed circuit board and coupled to the memory circuitry.

19. A serial data interface for use with a programmable logic device having a programmable logic core, said serial data interface being adapted to receive and deserialize a serial data signal, said serial data interface comprising:
bit-slipping circuitry adapted to insert a byte boundary between bits of said deserialized serial data signal, said bit-slipping circuitry being responsive to a bit-slipping control signal from said programmable logic core.

20. The serial data interface of claim 19 wherein said bit-slipping circuitry comprises bit-handling circuitry and control circuitry that controls said bit-handling circuitry responsive to said bit-slipping control signal.

21. The serial data interface of claim 20 wherein:
each byte includes a first number of bits; and
said bit-handling circuitry comprises:
at least one shift register for receiving said serial data, and having capacity to hold a second number of bits greater than said first number of bits, and further having a number of parallel outputs equal to said second number of bits, and
selection circuitry having a number of selection inputs equal to said number of parallel outputs of said at least one shift register, and having a number of selection outputs equal to said first number of bits, said selection inputs being connected to said parallel outputs of said at least one shift register; wherein:
said control circuitry controls which of said selection inputs is connected to said selection outputs.

22. The serial data interface of claim 21 wherein said selection circuitry is a barrel shifter.

23. The serial data interface of claim 21 wherein said second number of bits is twice said first number of bits.

24. The serial data interface of claim 23 wherein said at least one shift register comprises two shift registers chained serially, each of said shift registers having capacity to hold said first number of bits.

25. A programmable logic device comprising the serial data interface of claim 19.

26. A digital processing system comprising:
processing circuitry;
a memory coupled to said processing circuitry; and
a programmable logic device as defined in claim 25 coupled to the processing circuitry and the memory.

27. A printed circuit board on which is mounted a programmable logic device as defined in claim 25.

28. The printed circuit board defined in claim 27 further comprising:
memory circuitry mounted on the printed circuit board and coupled to the programmable logic device.

29. The printed circuit board defined in claim 28 further comprising:
processing circuitry mounted on the printed circuit board and coupled to the memory circuitry.

* * * * *